(12) United States Patent
Chi et al.

(10) Patent No.: US 8,158,524 B2
(45) Date of Patent: Apr. 17, 2012

(54) LINE WIDTH ROUGHNESS CONTROL WITH ARC LAYER OPEN

(75) Inventors: Kyeong-Koo Chi, San Jose, CA (US); Jonathan Kim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 884 days.

(21) Appl. No.: 12/210,777

(22) Filed: Sep. 15, 2008

(65) Prior Publication Data

US 2009/0087996 A1 Apr. 2, 2009

Related U.S. Application Data

(60) Provisional application No. 60/975,751, filed on Sep. 27, 2007.

(51) Int. Cl.
*H01L 21/302* (2006.01)
*H01L 21/461* (2006.01)
(52) U.S. Cl. .................. 438/706; 438/707; 438/725
(58) Field of Classification Search .................. None
See application file for complete search history.

(56) References Cited

U.S. PATENT DOCUMENTS

| | | | |
|---|---|---|---|
| 4,208,241 A | 6/1980 | Harshbarger et al. | |
| 5,376,228 A | 12/1994 | Yanagida | |
| 5,804,088 A * | 9/1998 | McKee | 216/47 |
| 6,057,239 A | 5/2000 | Wang et al. | |
| 6,187,688 B1 * | 2/2001 | Ohkuni et al. | 438/725 |
| 6,287,980 B1 | 9/2001 | Hanazaki et al. | |
| 6,492,263 B1 | 12/2002 | Peng et al. | |
| 6,630,407 B2 | 10/2003 | Keil et al. | |
| 6,635,185 B2 | 10/2003 | Demmin et al. | |
| 6,746,961 B2 | 6/2004 | Ni et al. | |
| 6,797,637 B2 | 9/2004 | Komagata | |
| 2006/0226120 A1 | 10/2006 | Rusu et al. | |
| 2006/0270230 A1 | 11/2006 | Abatchev et al. | |

FOREIGN PATENT DOCUMENTS

| | | |
|---|---|---|
| EP | 0 498 209 A1 | 8/1992 |
| EP | 0 498 209 B1 | 8/1992 |
| EP | 0 516 053 | 12/1992 |
| EP | 0 903 777 | 3/1999 |
| EP | 2004-363150 | 12/2004 |

(Continued)

OTHER PUBLICATIONS

International Search Report dated Feb. 23, 2009 from International Patent Application No. PCT/US2008/076435.

(Continued)

*Primary Examiner* — Duy Deo
(74) *Attorney, Agent, or Firm* — Beyer Law Group LLP

(57) ABSTRACT

To achieve the foregoing and in accordance with the purpose of the present invention a method for etching an etch layer disposed below an antireflective coating (ARC) layer below a patterned mask is provided. The ARC layer is opened, and features are etched into the etch layer through the patterned mask. The opening the ARC layer includes (1) providing an ARC opening gas comprising a halogen containing gas, COS, and an oxygen containing gas, (2) forming a plasma from the ARC opening gas to open the ARC layer, and (3) stopping providing the ARC opening gas to stop the plasma. The patterned mask may be a photoresist (PR) mask having a line-space pattern. COS in the ARC opening gas reduces line width roughness (LWR) of the patterned features of the etch layer.

13 Claims, 11 Drawing Sheets

FOREIGN PATENT DOCUMENTS

| | | |
|---|---|---|
| FR | 2673763 | 9/1992 |
| JP | 2000-277494 | 10/2000 |
| JP | 2004-087896 | 3/2004 |
| WO | 97/24750 | 7/1997 |
| WO | 2006/107495 | 10/2006 |

OTHER PUBLICATIONS

Written Opinion dated Feb. 23, 2009 from International Patent Application No. PCT/US2008/076435.
Office Action dated Mar. 6, 2009 from U.S. Appl. No. 11/095,932.
International Search Report dated Sep. 11, 2006 from PCT/US2006/008302.
Written Opinion dated Sep. 11, 2006 from PCT/US2006/008302.
Office Action dated Apr. 6, 2007 for U.S. Appl. No. 11/095,932.
Office Action dated Sep. 24, 2007 from U.S. Appl. No. 11/095,932.
Office Action dated Jul. 28, 2008 from U.S. Appl. No. 11/095,932.
Written Opinion dated Dec. 1, 2008 from Singapore Patent Application No. 200708501-2.
Search Report dated Dec. 1, 2008 from Singapore Patent Application No. 200708501-2.

* cited by examiner

+0COS/44s

+5COS/44s

+10COS/49s

+15COS/49s

+0COS/44s

+5COS/44s

+10COS/49s

+15COS/49s

LINE WIDTH ROUGHNESS CONTROL WITH ARC LAYER OPEN

CROSS REFERENCE TO RELATED APPLICATIONS

This application claims priority under 35 U.S.C. §119(e) from U.S. Provisional Application No. 60/975,751, entitled "LINE WIDTH ROUGHNESS CONTROL WITH ARC LAYER OPEN", filed Sep. 27, 2007, and naming Chi et al. as inventors, which is incorporated by reference in its entirety for all purposes.

BACKGROUND OF THE INVENTION

The present invention relates to etching an etch layer through a mask during the production of a semiconductor device. More specifically, the present invention relates to controlling the line width roughness (LWR) of fine features with opening of an antireflective coating layer through a mask during the production of semiconductor devices.

During semiconductor wafer processing, features of the semiconductor device are defined in the wafer using well-known patterning and etching processes. In these processes (photolithography), a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Typically, in photolithography steps, one or more antireflective coating (ARC) layers, for example, a bottom antireflective coating (BARC) and/or a dielectric antireflective coating (DARC) layer are provided under a photoresist mask. These layers minimize or eliminate reflections during exposure of the photoresist which may produce standing waves. Such standing waves may result in defects such as sinusoidal "scalloping" of the photoresist sidewalls, or the formation of "feet" at the base of the photoresist layer. Therefore, BARC/DARC layers are generally disposed below a photoresist layer and above other device materials (e.g. $SiO_2$) to be etched through the photoresist mask. BARC/DARC layers may be organic-based or inorganic-based, and are usually composed of different materials than the underlying dielectric material. For example, an inorganic BARC layer may be composed of titanium nitride (TiN) as well as silicon oxynitride (SiON).

The critical dimension (CD) uniformity in ultra large scale integrated circuits (ULSI) is a crucial parameter for high performance devices. The CD uniformity in the gate electrode, for example, affects the threshold voltage distribution and the overall yield of the devices. As the design rules of ULSI reduced, the roughness of the edges of the lines (Line Width Roughness: LWR) of linear features patterned by photolithography becomes worse. The LWR is a measure of how smooth the edge of a linear feature is when viewed from the top down. The ideal feature has an edge that is "straight like a ruler" as shown in FIG. 1A. However, for various reasons the line feature may sometimes instead appear jagged as shown in FIG. 1B. Jagged lines (i.e., with a high LWR) are generally very undesirable because the CD measured along the liner feature would vary from position to position, rendering operation of the resulting device unreliable.

Argon-fluoride (ArF) excimer laser having wavelength of 193 nm (ArF lithography technology) has been used to for the production of sub 0.04 µm devices. The immersion 193 nm lithography technology enables processes below the 110 nm node. Such small features in most highly integrated circuits require higher resolution and the CD uniformity. Accordingly, the LWR problem worsens in the 193 nm lithography technology.

SUMMARY OF THE INVENTION

To achieve the foregoing and in accordance with the purpose of the present invention a method for etching an etch layer disposed below an antireflective coating (ARC) layer below a patterned mask is provided. The ARC layer is opened, and features are etched into the etch layer through the patterned mask. The opening the ARC layer includes (1) providing an ARC opening gas comprising a halogen containing gas, COS, and an oxygen containing gas, (2) forming a plasma from the ARC opening gas to open the ARC layer, and (3) stopping providing the ARC opening gas to stop plasma. The patterned mask may be a photoresist (PR) mask having a line-space pattern. COS in the ARC opening gas reduces line width roughness (LWR) of the patterned features of the etch layer.

In another manifestation of the invention, a method for reducing line width roughness (LWR) in etching of an etch layer disposed below an antireflective coating (ARC) layer below a patterned mask is provided. The patterned mask may have a line-space pattern. The ARC layer is opened, and features are into the etch layer through the patterned mask. In the ARC layer opening, an ARC opening gas comprising a halogen containing gas, COS, and an oxygen containing gas is provided. A plasma is formed from the ARC opening gas to open the ARC layer, and providing the ARC opening gas is stopped to stop the plasma. The ARC layer may include at least one of a bottom antireflective coating (BARC) layer, or a dielectric antireflective coating (DARC) layer.

In yet another manifestation of the invention, an apparatus for etching an etch layer disposed below an antireflective coating (ARC) layer below a patterned mask is provided. The apparatus includes a plasma processing chamber. The plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. The plasma processing chamber further includes a gas source and a controller. The gas source is in fluid connection with the gas inlet, and includes an ARC opening gas source including a halogen containing gas source, a COS gas source, and an oxygen containing gas source, and an etch gas source. The controller is controllably connected to the gas source and the at least one RF power source, and includes at least one processor and computer readable media. The computer readable media includes computer readable code for opening the ARC layer, and computer readable code for etching features into the etch layer through the opened ARC and the patterned mask. The computer readable code for opening the ARC layer includes computer readable code for flowing an ARC opening gas comprising a halogen containing gas, COS, and an oxygen containing gas from the halogen containing gas source, the COS gas source, and the oxygen containing gas source, respectively, into the plasma chamber, computer readable code for forming a plasma from the ARC opening gas, and computer readable code for stopping the flow of the ARC opening gas. The computer readable code for etching features into the etch layer through the opened ARC and the patterned mask includes computer readable code for providing an etch gas from the etch gas source, computer readable code for forming a plasma from the etch gas, and computer readable code for stopping the etch gas. The computer readable media further includes computer readable code for removing the patterned mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figures 1A, 1B:
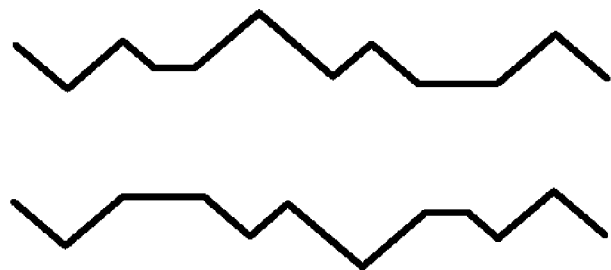
FIGS. 1A-B are schematic diagram for explaining line width roughness.
Figure 2A:
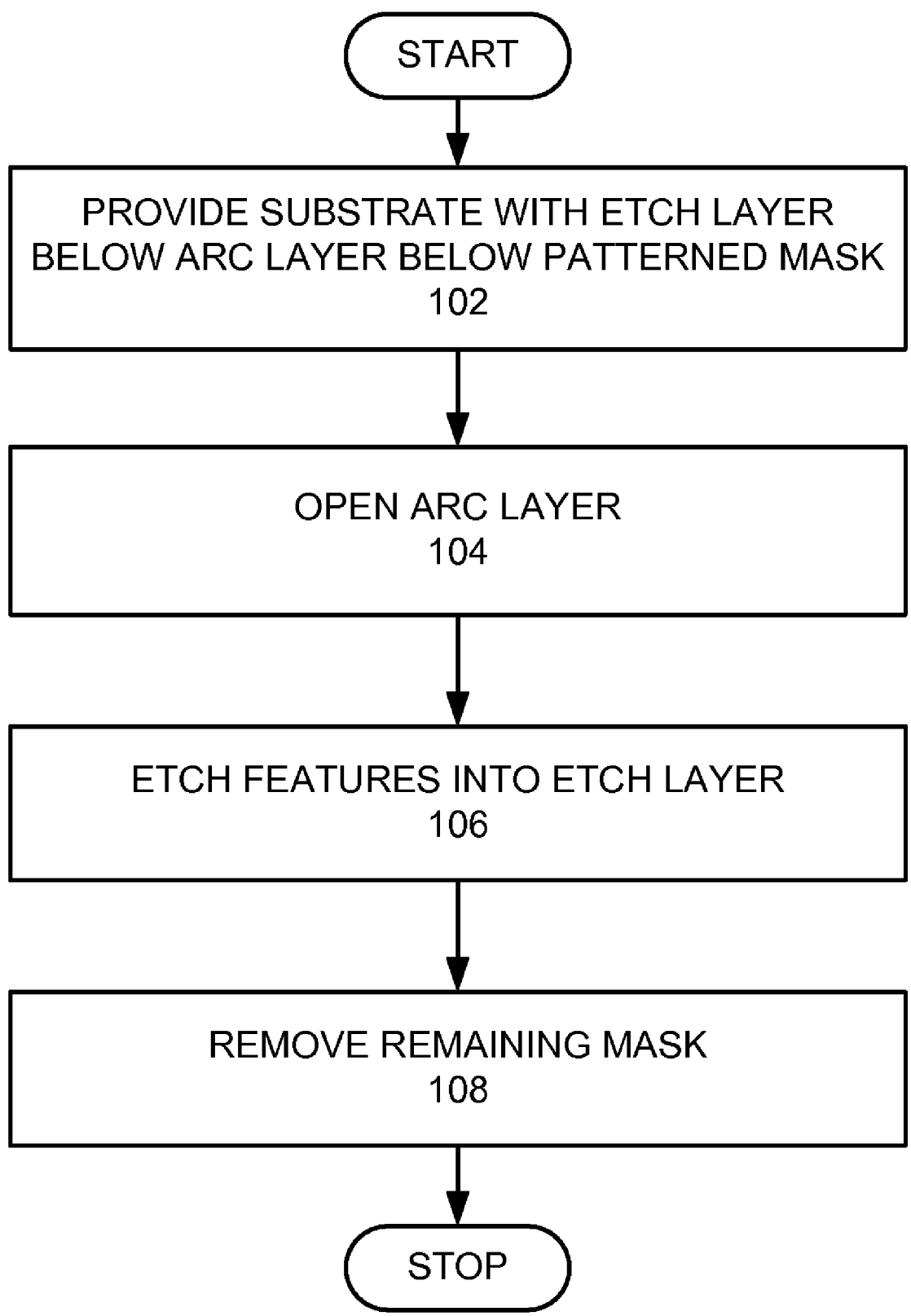
FIG. 2A is a high level flow chart of a process used in an embodiment of the invention.
Figure 3:
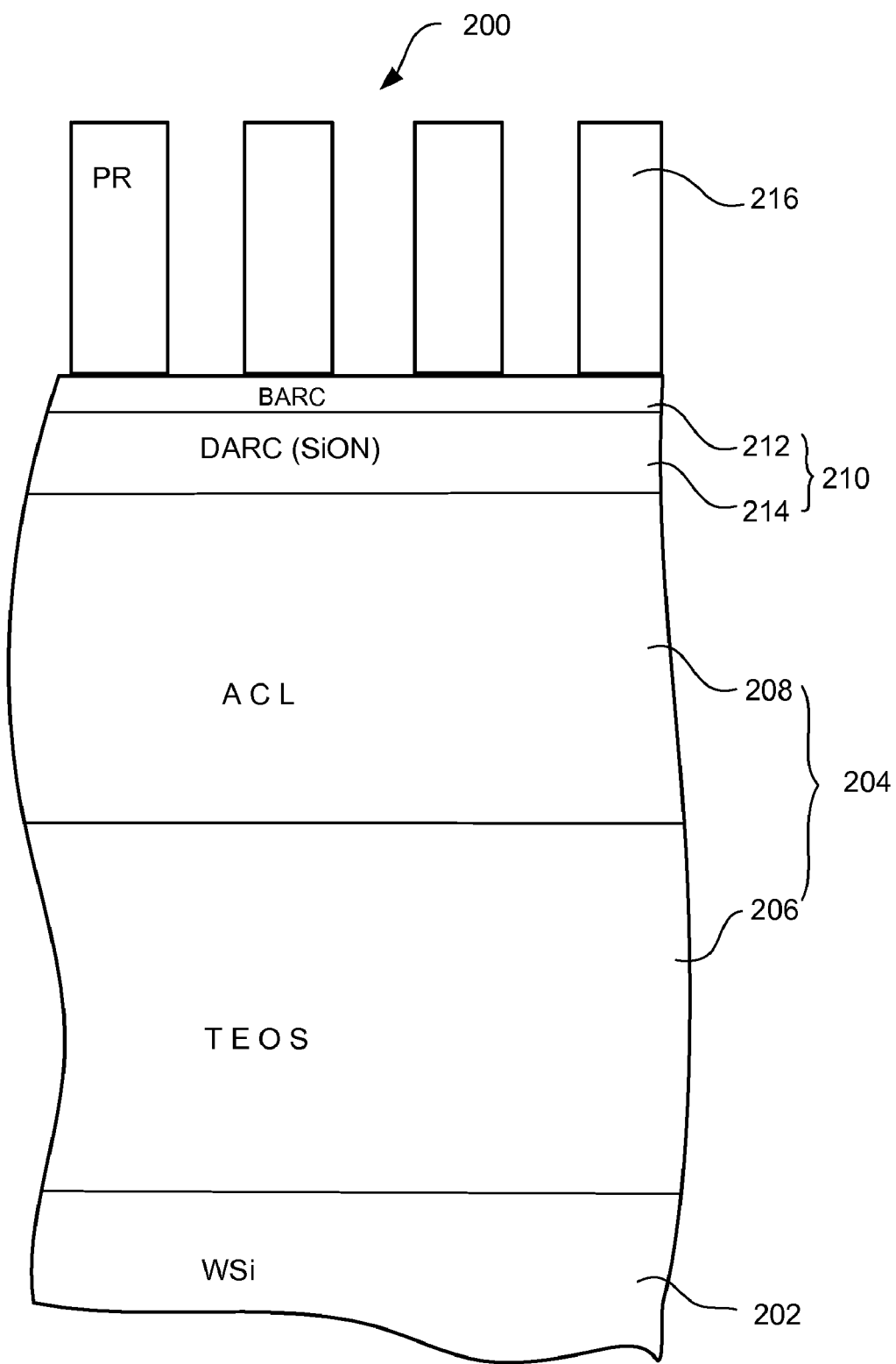
FIG. 3 is a schematic cross-sectional view of a stack of layers formed on a substrate, including an etch layer disposed below an ARC layer below the patterned mask, processed in accordance with one embodiment of the present invention.

To facilitate understanding, FIG. 2A is a high level flow chart of a process used in an embodiment of the invention. A substrate with an etch layer disposed below an antireflective coating (ARC) layer below a patterned mask is provided (step 102). To facilitate understanding of the invention, FIG. 3 is a schematic cross-sectional view of a stack 200 of layers formed on a substrate 202, including an etch layer 204 disposed below an ARC layer 210 below the patterned mask 216. The patterned mask 212 may be a photoresist (PR) mask. In this example, the mask 216 is a PR mask having a line-space pattern to form a plurality of lines and spaces in the etch layer. The PR mask 216 may be patterned with the immersion 193 nm photolithography having a CD about 40 nm.

As shown in FIG. 3, the etch layer 204 may include a dielectric layer 206 and an amorphous carbon layer (ACL) 208. The dielectric layer 206 may be made of a silicon oxide based dielectric material such as $SiO_2$, silicon nitride (SiN), or tetora-ethyl-ortho-silicate (TEOS). Amorphous carbon is similar to a polymer, but with less hydrogen and more carbon since it is deposited at high temperature greater than 200 C by CVD, and thus it is more etch resistant than polymer. The ARC layer 210 may include a bottom antireflective coating (BARC) layer 212 formed blow the PR mask 216, and a dielectric antireflective coating (DARC) layer 214 below the BARC layer 212. These layers minimize or eliminate reflections during exposure of the photoresist. The BARC/DARC layers may be organic-based or inorganic-based, and are usually composed of different materials than the underlying dielectric material. For example, when the BARC layer 212 is carbon-based organic layer, and the upper etch layer (the ACL 208 in this example) is also carbon-based material, an inorganic BARC layer, such as silicon oxynitride (SiON), will prevent the etch layer from undesirably being etched during an ARC layer opening process. In a specific example, the stack 200 may have the PR mask 216 with a thickness of about 100 nm, the BARC layer 212 with a thickness of about 20 nm, the DARC layer 214 with a thickness of about 40 nm, the ACL layer 208 with a thickness of about 220 nm, and the dielectric (such as TEOS or PE-TEOS) layer 206 with a thickness of about 210 nm. This structure may be suitable for gate electrodes in semiconductor devices. In this example, the target feature in the dielectric layer 206 may have a high aspect ratio that is 5:1 or greater, preferably 10:1 or greater.

Figure 4A:
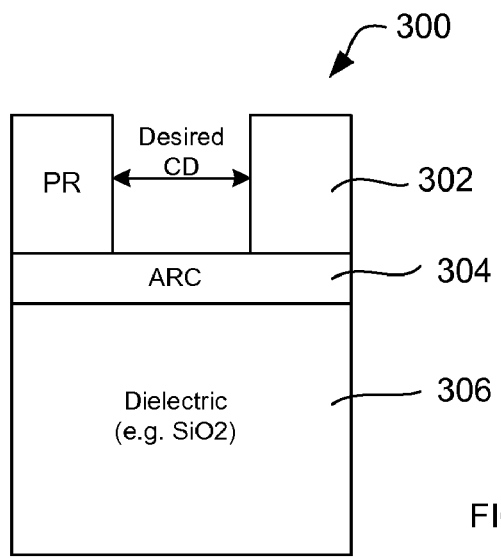
FIGS. 4A-4C schematically illustrate a stack of a patterned PR mask, an ARC layer, and an etch layer where the etch layer has a CD defect after an ARC layer opening step and an etching step.
Figure 4B:
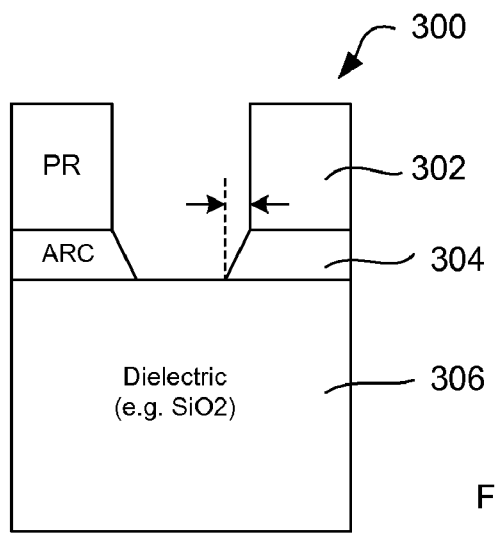
Figure 4C:
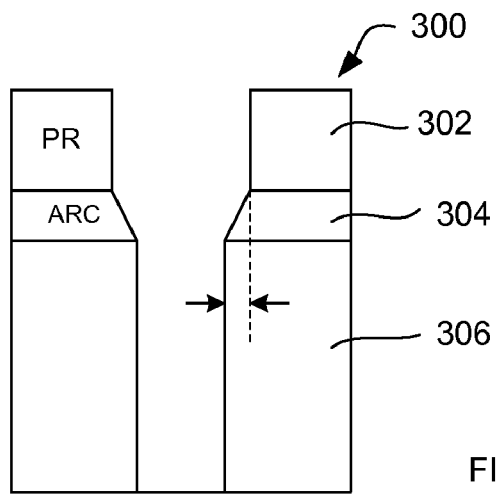

Referring back to FIG. 2A, the ARC layer 210 is opened (step 104) using the PR mask 216 as an etch mask. Typically the first step of an etch process is to open any ARC layer (or BARC/DARC layers). This is typically a critical step, because the ARC layer acts like a mask for the layers underneath. That is, certain types of defects which may be present in the ARC layer may translate into similar defects in features in the underlying etch layers (such as a dielectric layer). For example, such defects may be defects in the critical dimensions (CD). The photoresist mask generally defines the desired feature sizes. If, after etch, the ARC layer is narrower than the photoresist opening (as in the case of a "foot" defect), then the final CD of the underlying etch layer may also be narrower than desired, as shown in FIGS. 4A-4C. FIG. 4A schematically illustrates a stack 300 of a patterned PR mask 302, an ARC layer 304, and an etch layer 306 where the patterned mask 302 has a desired CD. FIG. 4B schematically illustrates the stack 300 after an ARC opening process, in which the CD is narrowed due to the "foot" effect. FIG. 4C schematically illustrates the stack 300 after a main (dielectric) etch process in which the narrower CD is transferred to the narrower CD of the etched features in the etch layer 306.

In the case of a PR mask with a line-space pattern, if the opened ARC layer has rough edges, that is, the linear openings of the ARC layer have uneven or non-uniform opening width, such a rough ARC layer may also results in features etched in the dielectric layer with line width roughness. Contrary to controlling uniformity or evenness in vertical profiles of the etched features, such as contacts or via holes, the present invention controls the uniformity or evenness of the etched features in the horizontal direction when the features are viewed from the top.

Figure 5:
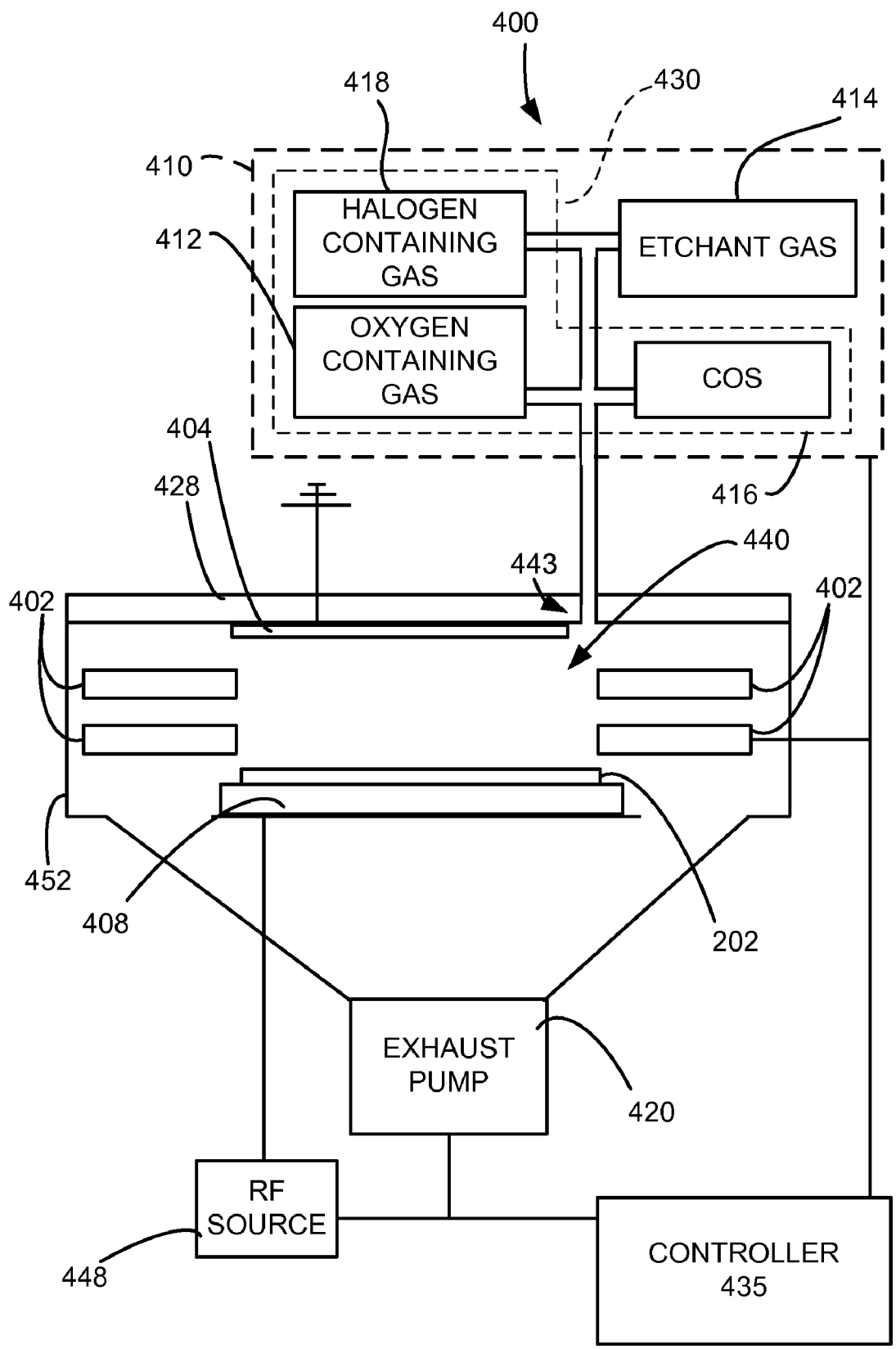
FIG. 5 is a schematic view of a plasma processing chamber that may be used for opening an ARC layer and optionally for etching an etch layer in accordance with one embodiment of the present invention.

FIG. 5 is a schematic view of a plasma processing chamber 400 that may be used for inventive etching. The plasma processing chamber 400 comprises confinement rings 402, an upper electrode 404, a lower electrode 408, a gas source 410, and an exhaust pump 420 connected to a gas outlet. Within plasma processing chamber 400, the substrate 202 (with the stack of layers) is positioned upon the lower electrode 408. The lower electrode 408 incorporates a suitable substrate chucking mechanism (e.g., electrostatic, mechanical clamping, or the like) for holding the substrate 202. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. Besides helping to exhaust the gas, the exhaust pump 420 helps to regulate pressure. In this embodiment, the gas source 410 comprises an ARC opening gas sources 430 including a COS source 412, an oxygen containing gas source 416, and a halogen congaing gas source 418. The gas source 410 may further comprise other gas sources, such as an etching gas source 414 for the subsequent tech processes for the etch layer to be performed in the processing chamber 400.

As shown in FIG. 5, an RF source 448 is electrically connected to the lower electrode 408. Chamber walls 452 surround the confinement rings 402, the upper electrode 404, and the lower electrode 408. The RF source 448 may comprise a 2 MHz power source, a 60 MHz power source, and a 27 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 27 MHz, 2 MHz, and 60 MHz power sources make up the RF power source 448 connected to the lower electrode, and the upper electrode is grounded. A controller 435 is controllably connected to the RF source 448, exhaust pump 420, and the gas source 410.

Figure 6A:
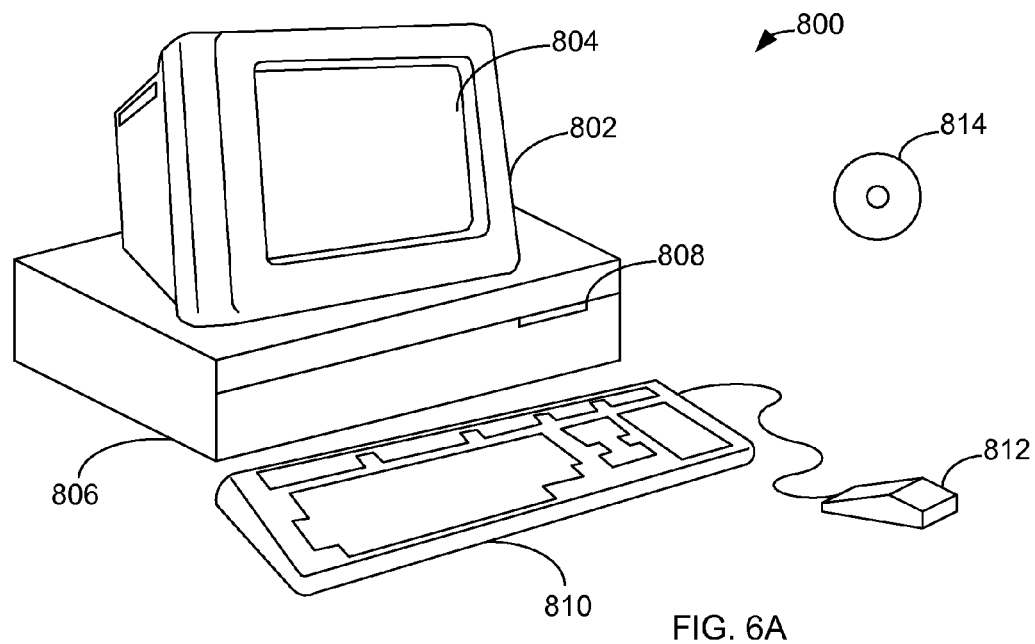
FIGS. 6A-B illustrate a computer system, which is suitable for implementing a controller used in embodiments of the present invention.
Figure 6B:
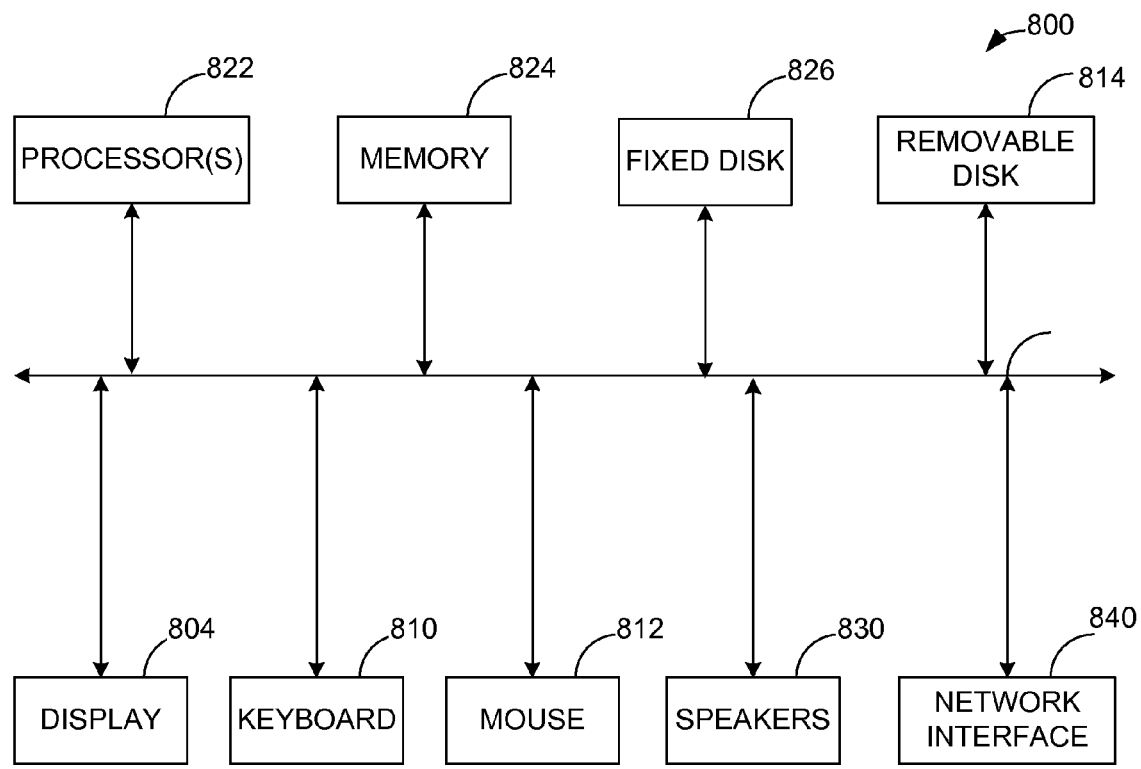

FIGS. 6A and 6B illustrate a computer system 800, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 6B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
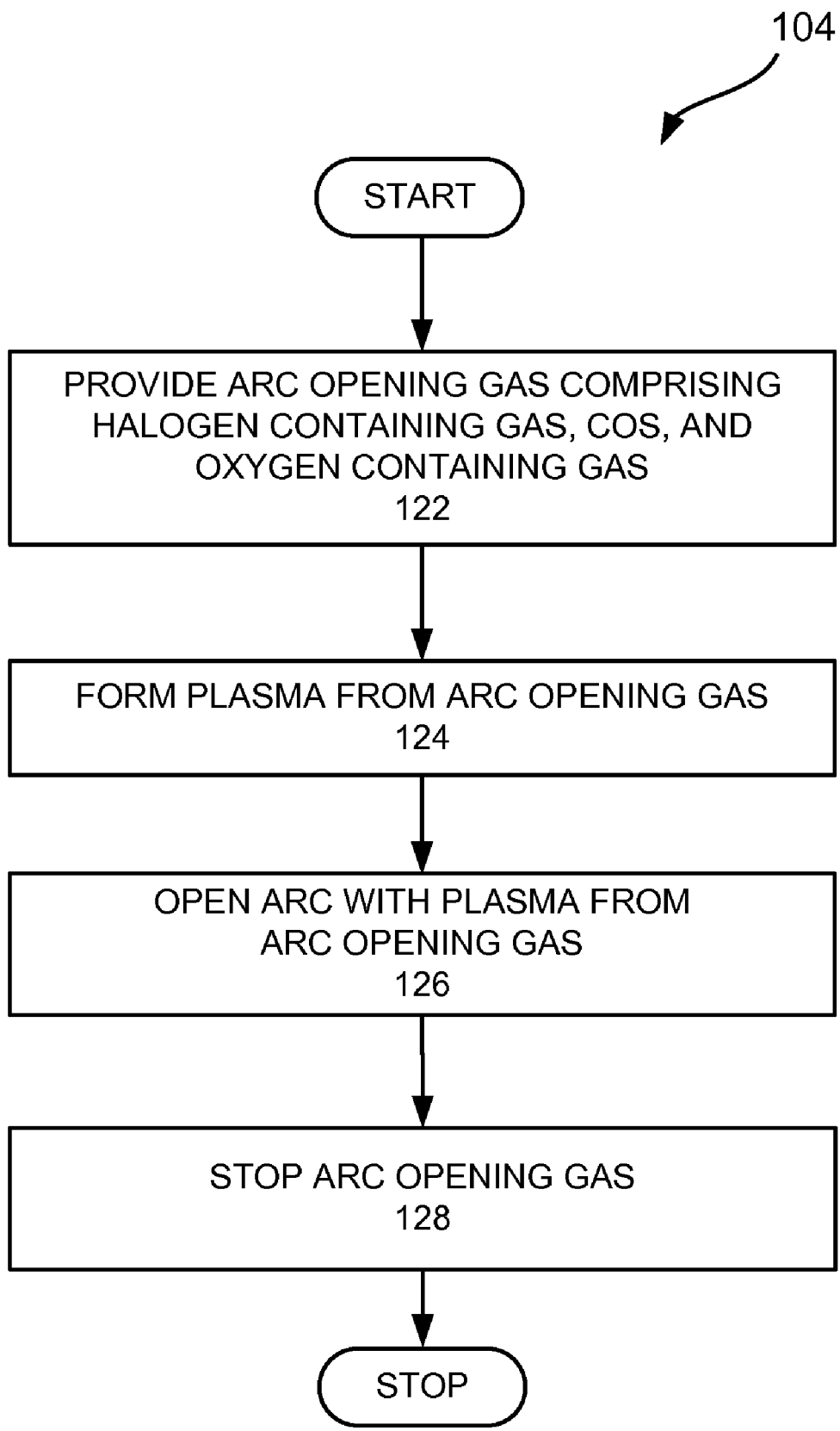
FIG. 2B is a detailed flow chart for the ARC layer opening in accordance with one embodiment of the present invention.

After FIG. 2B is a detailed flow chart for the ARC layer opening (step 104), which may be performed using the plasma processing chamber 400 described above. The substrate 202 having the stack 200 is provided in the plasma processing chamber 400. Prior to opening the ARC layer, the patterning of the mask 216 may also be performed in the same processing chamber 400. In the ARC layer opening process (step 104), an ARC opening gas comprising a halogen containing gas, COS, and an oxygen containing gas is provided (step 122), as shown in FIG. 2B. In one embodiment of the present invention, the halogen containing gas may contain at least one of $CF_4$ or $CHF_3$. More generally, the halogen containing gas may contain hydrocarbon, fluorocarbon, and/or hydrofluorocarbon components, for example, $CH_2F_2$, $CH_3F$, and the like. In a specific example, the pressure in the plasma chamber is set at 70 mTorr, and the ARC opening gas including 175 sccm $CF_4$, 26 sccm $CHF_3$, 5-15 sccm COS, and 9 sccm $O_2$ is provided. More generally, it is preferable that COS has about 1 to 70% of the total flow of the etchant gas. Preferably, COS has about 2-50% of the total flow of the etchant gas. More preferably, COS ahs about 3-10% of the total flow of the etchant gas Then, a plasma is formed from the ARC opening gas (step 124) so as to open the ARC layer (step 126). In this example, the RF source provides 400 Watts at 60 MHz for 44-49 seconds. After opening the ARC layer, the ARC opening gas flow is stopped so as to stop the plasma (step 128).

In accordance with an embodiment of the invention, as shown in FIG. 2A, features may be etched into the etch layer 202 (step 106) using the same plasma processing chamber 400 that used for opening the ARC layer. For example, the ACL 208 may be etched using the opened ARC layer 210 as a mask. For example, such ACL etch may use chemistry including 70 sccm $N_2$ and 200 sccm $O_2$ under the chamber pressure of 15 mTorr. The RF power source provides 700 Watts at 60 MHz for 68 seconds. Then, the dielectric layer 206 may be etched to form features using the patterned ACL 208 as the etch mask. For example, the dielectric etch may use chemistry including 1200 sccm Ar, 135 sccm $CF_4$, and 6 sccm $O_2$ under the chamber pressure of 70 mTorr. The RF power source provides 250 Watts at 60 MHz and 250 Watts at 2 MHz for 132 seconds. In this example, the patterned ACL 208 may be considered as a hardmask for the dielectric etch. Thus, any remaining mask may be removed (step 108) by ashing process or like.

Figure 7A:
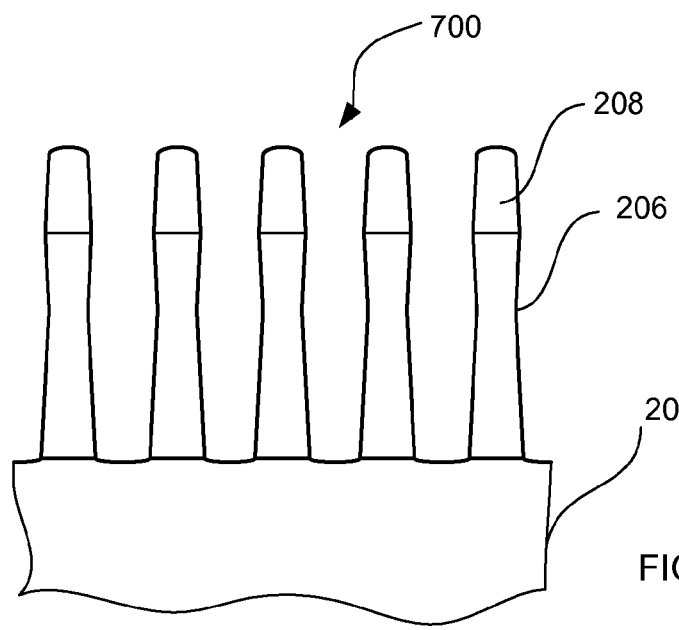
FIG. 7A schematically illustrates an example of a cross-sectional view of the stack of the layers after the dielectric etch step in accordance with one embodiment of the present invention.
Figure 7B:
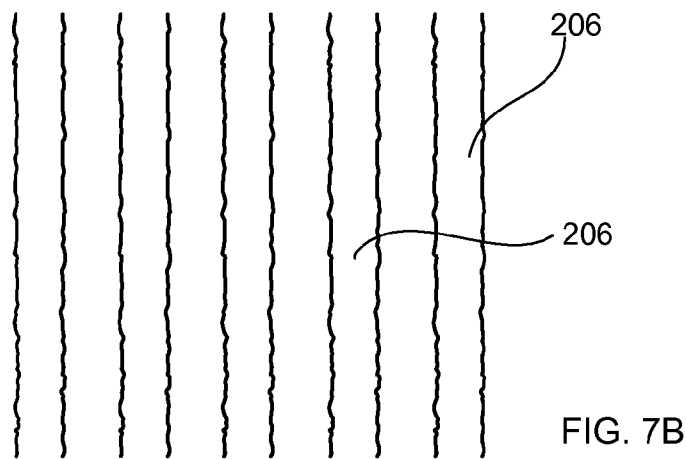
FIG. 7B schematically illustrates an example of the top view of the stack taken after the remaining ACL is removed, which corresponding to FIG. 7A.
Figure 7C:
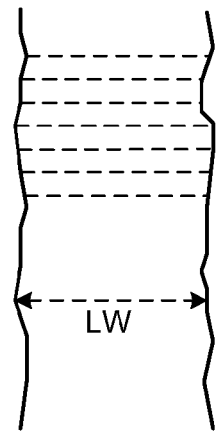
FIG. 7C schematically illustrates an example of line width measurement in accordance with one embodiment of the present invention.
Figure 8A:
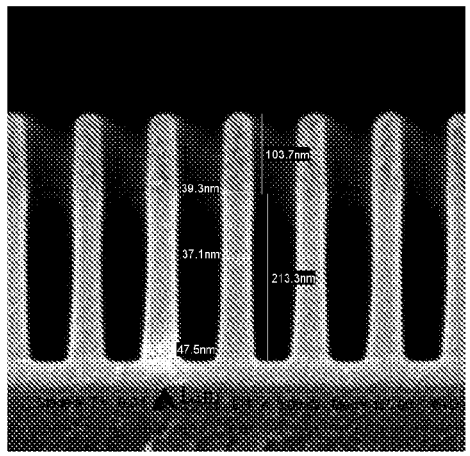
FIG. 8A shows an example of the profile of a stack after etching process where the ARC opening chemistry contains no COS.
Figure 8B:
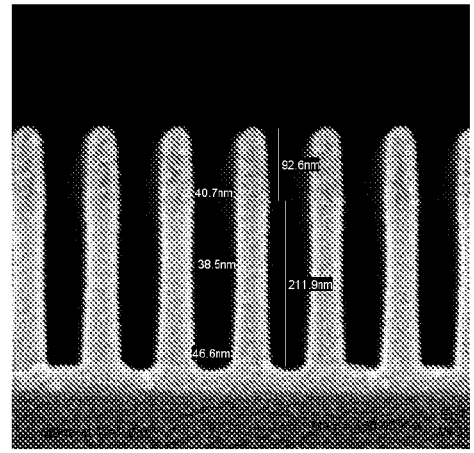
FIGS. 8B-8D show examples of the profile where 5 sccm, 10 sccm, and 15 sccm COS is added to the ARC opening chemistry, respectively, in accordance with one embodiment of the present invention.
Figure 8C:
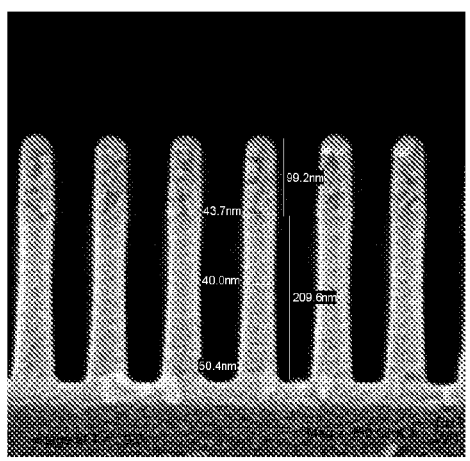
Figure 8D:
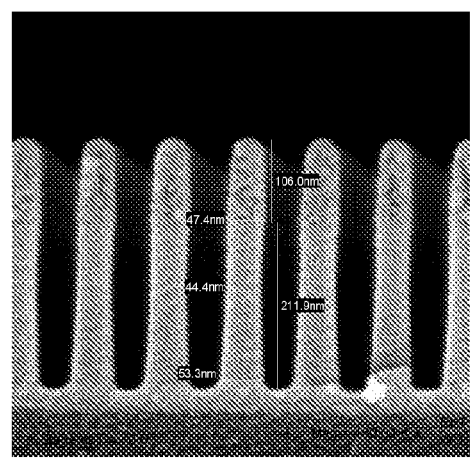
Figure 9A:
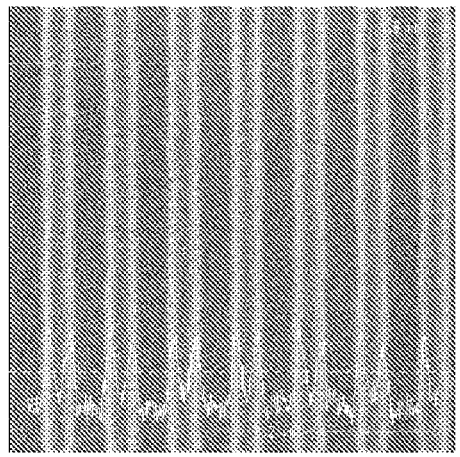
FIGS. 9A-9D show corresponding top views of FIGS. 8A-8D which are taken after the remaining ACL is removed.
Figure 9B:
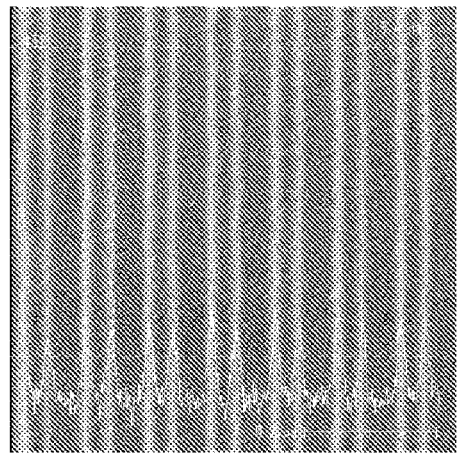
Figure 9C:
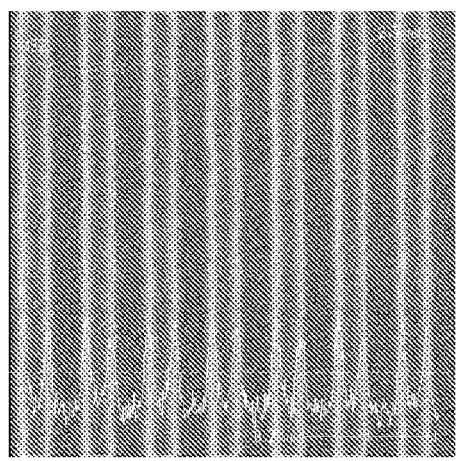
Figure 9D:
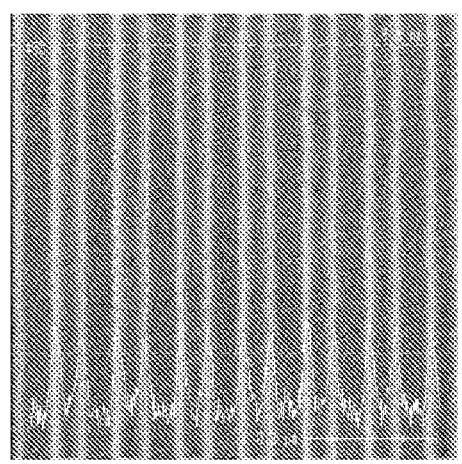

FIG. 7A schematically illustrates an example of a cross-sectional view of the stack 700 of the layers after the dielectric etch (step 106). As shown in FIG. 7A, the features having a line-space pattern are etched into the dielectric layer 206. Part of the ACL 208 remains on the top of the etched dielectric layer 206. FIG. 7B schematically illustrates an example of the corresponding top view of the stack 700 after the remaining ACL is removed (step 108). FIGS. 8A-8D are examples of scanning electron microscopy (SEM) images of the stack etched using the ARC, where the ARC opening chemistry contains COS of various amounts (flow rates). FIG. 8A shows the profile where no COS is added to the ARC opening chemistry as a reference. FIGS. 8B-8D show the profiles where 5 sccm, 10 sccm, and 15 sccm COS is added to the ARC opening chemistry, respectively. FIGS. 9A-9D are top view SEM mages corresponding to FIGS. 8A-8D which are taken after the remaining ACL is removed (step 108). With respect to the vertical profile of the etched features, there is no significant change depending on the use of the specific ARC opening chemistry. However, when the line width (LW) of the line (the width of the dielectric layer 206) along the etched line features is measured after the ACL 208 is removed, the LWR is improved (i.e., reduced) when the ACR opening chemistry contains COS. As shown in FIG. 7C, the line width may be measured at a certain number of points along the line, and statistical parameters such as the first quartile, the median, and the third quartile may be obtained in order to evaluate the LWR.

Figure 10:
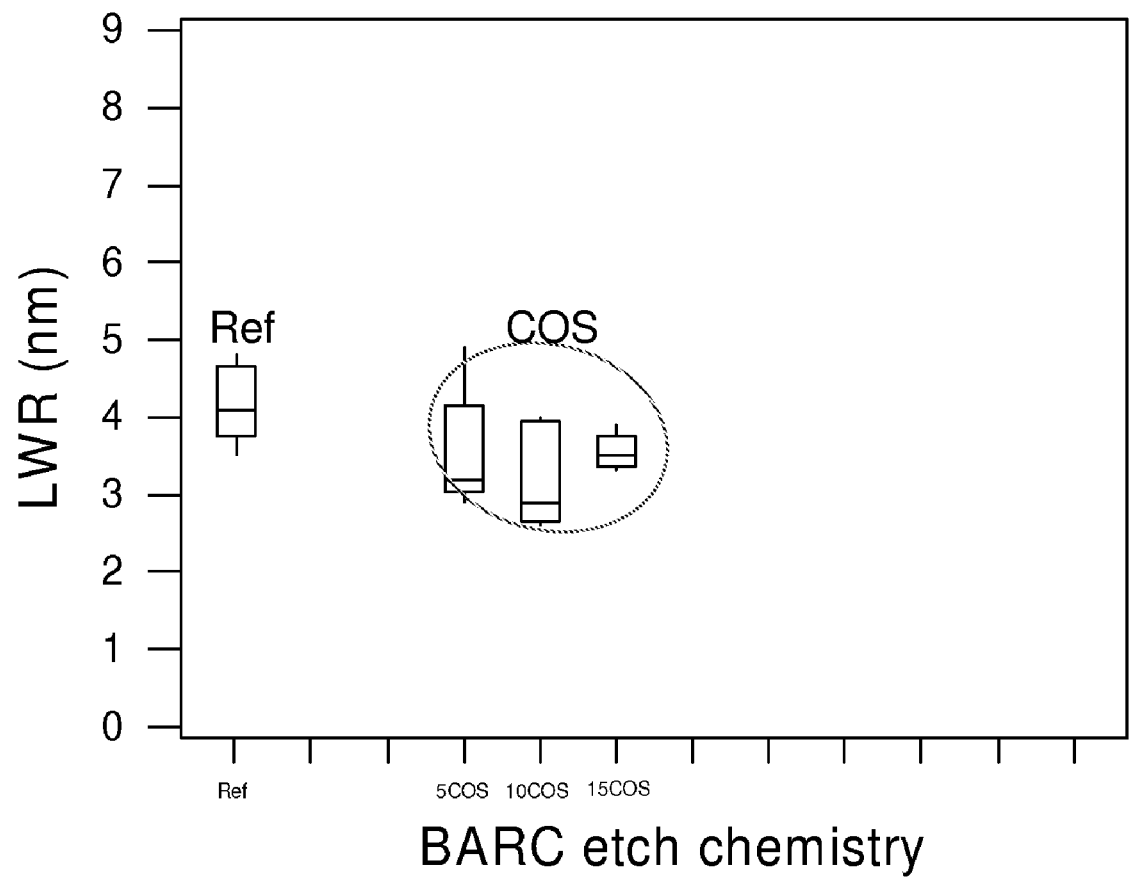
FIG. 10 is a box-and-whisker plot of the measured LWR's for the features corresponding to FIGS. 9A-9D.

FIG. 10 is a box-and-whisker plot (also referred to as box plot) of the measured LWR's for the features corresponding to FIGS. 9A-9D. Here, the line dividing each box is at the median value, and the box represents the inter quartile range (IQR) (the third quartile–the first quartile). The "whiskers" illustrate the minimum and maximum values. As shown in FIG. 10, by adding COS in the ARC opening chemistry, the LWR is reduced.

In other embodiments of the invention, the etch layer may be un-doped or doped silicon dioxide based material (e.g. TEOS, BPSG, FSG etc), organo-silicate glass (OSG), porous OSG, silicon nitride based material, silicon oxynitride based material, silicon carbide based material, low k-dielectric or any metal gate material. In other embodiments of the invention, the etch layer may be un-doped or doped silicon dioxide based material (e.g. TEOS, PE-TEOS, BPSG, FSG etc), silicon nitride based material (SixNy), silicon carbide based material, or low-k dielectrics, which may be either organic based or silicon oxide based, such as SiLK or organo silicate glass (OSG), or any metal gate material.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching an etch layer disposed below an antireflective coating (ARC) layer below a patterned mask, the method comprising:
  opening the ARC layer, comprising:
    providing an ARC opening gas comprising a halogen containing gas, COS, and an oxygen containing gas;
    forming a plasma from the ARC opening gas to open the ARC layer; and
    stopping providing the ARC opening gas to stop the plasma; and
  etching features into the etch layer through the patterned mask.

2. The method as recited in claim 1, wherein the patterned mask is a photoresist (PR) mask having a line-space pattern, and wherein COS in the ARC opening gas reduces line width roughness (LWR) of the patterned features of the etch layer.

3. The method as recited in claim 1, wherein the ARC layer includes at least one of:
  a bottom antireflective coating (BARC) layer; or
  a dielectric antireflective coating (DARC) layer.

4. The method as recited in claim 1, wherein the halogen containing gas includes at least one of:
  $CF_4$; or
  $CHF_3$.

5. The method as recited in claim 1, wherein COS has about 1 to 70% of a total flow of the etchant gas.

6. The method as recited in claim 5, wherein COS has about 2 to 50% of a total flow of the etchant gas.

7. The method as recited in claim 6, wherein COS has about 3 to 10% of a total flow of the etchant gas.

8. A method for reducing line width roughness (LWR) in etching of an etch layer disposed below an antireflective coating (ARC) layer below a patterned mask having a line-space pattern, the method comprising:

opening the ARC layer, comprising:

providing an ARC opening gas comprising a halogen containing gas, COS, and an oxygen containing gas;

forming a plasma from the ARC opening gas to open the ARC layer; and stopping providing the ARC opening gas to stop the plasma; and etching features into the etch layer through the patterned mask.

9. The method as recited in claim 8, wherein the ARC layer includes at least one of:

a bottom antireflective coating (BARC) layer; or a dielectric antireflective coating (DARC) layer.

10. The method as recited in claim 8, wherein the halogen containing gas includes at least one of:

$CF_4$; or $CHF_3$.

11. The method as recited in claim 8, wherein COS has about 1 to 70% of a total flow of the etchant gas.

12. The method as recited in claim 11, wherein COS has about 2 to 50% of a total flow of the etchant gas.

13. The method as recited in claim 12, wherein COS has about 3 to 10% of a total flow of the etchant gas.

* * * * *